United States Patent
Pizzella et al.

(10) Patent No.: US 12,057,334 B2
(45) Date of Patent: Aug. 6, 2024

(54) CONTROL AND MONITORING SYSTEM FOR GAS DELIVERY SYSTEM

(71) Applicant: Watlow Electric Manufacturing Company, St. Louis, MO (US)

(72) Inventors: Miranda Pizzella, St. Louis, MO (US); Andrew D. Selvy, O'Fallon, MO (US); Chelsea Diestelkamp, St. Louis, MO (US); Cory Brandes, St. Louis, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 925 days.

(21) Appl. No.: 17/089,447

(22) Filed: Nov. 4, 2020

(65) Prior Publication Data

US 2021/0134630 A1     May 6, 2021

Related U.S. Application Data

(60) Provisional application No. 62/930,272, filed on Nov. 4, 2019.

(51) Int. Cl.
    *H01L 21/67*     (2006.01)
(52) U.S. Cl.
    CPC .. *H01L 21/67253* (2013.01); *H01L 21/67017* (2013.01)
(58) Field of Classification Search
    CPC ......... H01L 21/67017; H01L 21/67248; H01L 21/67253
    See application file for complete search history.

(56) References Cited

U.S. PATENT DOCUMENTS

| | | | |
|---|---|---|---|
| 2009/0005908 A1* | 1/2009 | Butoyi | ................. C07C 51/313 700/266 |
| 2015/0055940 A1 | 2/2015 | Steinhauser | |
| 2016/0345384 A1* | 11/2016 | Zhang | ............... H01L 21/67248 |

FOREIGN PATENT DOCUMENTS

| | | |
|---|---|---|
| CN | 101520645 | 9/2009 |
| TW | M422089 | 2/2012 |
| TW | I546636 | 8/2016 |

(Continued)

OTHER PUBLICATIONS

International Search Report for International Application PCT/US2020/058918, mailed Feb. 16, 2021.

(Continued)

*Primary Examiner* — Jaehwan Oh
(74) *Attorney, Agent, or Firm* — Burris Law, PLLC

(57) ABSTRACT

A method for monitoring a semiconductor processing system including a gas delivery system, a thermal system, and a fluid flow line includes obtaining a plurality of operational data from the gas delivery system, the thermal system, or a combination thereof and determining a performance characteristic of the fluid flow line based on one or more operational data of the plurality of operational data. The method includes identifying one or more locations associated with the one or more operational data in a reference virtual model and generating a dynamic state model of the fluid flow line based on the reference virtual model, the one or more identified locations, and the determined performance characteristic, where the dynamic state model is a digital representation of the fluid flow line.

28 Claims, 6 Drawing Sheets

(56) References Cited

FOREIGN PATENT DOCUMENTS

TW           201642384 A     12/2016

OTHER PUBLICATIONS

Search report appended to an Office Action, which was issued to Taiwanese counterpart Application No. 111117798 by the TIPO on Jun. 6, 2023, an English Translation, 28 pages.

Search report appended to an Office Action, which was issued to Taiwanese counterpart Application No. 109138466 by the TIPO on Sep. 2, 2021.

* cited by examiner

| Zones | Temperature | Wattage | Voltage | S.P. | Ohm |
|---|---|---|---|---|---|
| 1 | ****** | 0.0 | 0.0 | 150.0 | 0.0 |
| 2 | ****** | 0.0 | 9.1 | 150.0 | 0.0 |
| 3 | ****** | 0.0 | 9.0 | 150.0 | 0.0 |
| 4 | ****** Text | 0.0 | 8.9 | 150.0 | 0.0 |
| 5 | ****** | 0.0 | 8.8 | 150.0 | 0.0 |
| 6 | ****** | 0.0 | 8.9 | 150.0 | 0.0 |

10:22:21 Zone 1 Deviation >20% of Setpoint

FIG. 5

CONTROL AND MONITORING SYSTEM FOR GAS DELIVERY SYSTEM

CROSS-REFERENCE TO RELATED APPLICATIONS

This application claims priority to and the benefit of U.S. Provisional Application No. 62/930,272 filed on Nov. 4, 2019. The disclosure of the above application is incorporated herein by reference.

FIELD

The present disclosure relates generally to semiconductor processing systems having a gas delivery system and a gas exhaust system and, more particularly, to control and monitoring systems for the gas delivery system and the gas exhaust system.

BACKGROUND

The statements in this section merely provide background information related to the present disclosure and may not constitute prior art.

A semiconductor processing system generally includes a processing chamber and a gas delivery system for delivering process gases to the processing chamber and for delivering exhaust gases outside of the processing chamber. Heaters are typically provided proximate, and in some cases, around gas lines of the gas delivery system. The process gases may be heated to a predetermined temperature as the process gases are delivered in the gas lines from a gas source to the processing chamber to facilitate the reaction process of the process gases in the processing chamber. The exhaust gases may be heated as the exhaust gas is delivered out of the processing chamber to facilitate an abatement process in a gas abatement system.

However, it takes time for the heaters to generate the required heat to heat the process and/or exhaust gases in the gas lines to a desired temperature. Clogging may occur in the gas lines when cold spots are present in the gas lines. The condition of the gases flowing in the gas lines is typically unknown to the operator. As a result, it is often not possible for the operator to control the heaters in a way to reduce the presence of cold spots before clogging occurs.

These issues with the monitoring of the gas lines and the slow response of the heaters for heating the gases, among other issues, are addressed by the present disclosure.

SUMMARY

This section provides a general summary of the disclosure and is not a comprehensive disclosure of its full scope or all of its features.

The present disclosure provides a method for monitoring a semiconductor processing system including a gas delivery system, a thermal system, and a fluid flow line. The method includes obtaining a plurality of operational data from the gas delivery system, the thermal system, or a combination thereof and determining a performance characteristic of the fluid flow line based on one or more operational data of the plurality of operational data. The method includes identifying one or more locations associated with the one or more operational data in a reference virtual model and generating a dynamic state model of the fluid flow line based on the reference virtual model, the one or more identified locations, and the determined performance characteristic, where the dynamic state model is a digital representation of the fluid flow line.

In some forms, the method further includes identifying the reference virtual model of the fluid flow line from among a plurality of reference virtual models stored in a database.

In some forms, the digital representation is one of a two-dimensional image and a three-dimensional image.

In some forms, the plurality of operational data includes temperature data of a heater, temperature data of the fluid flow line, electrical characteristic data of the heater, pump data of a pump, or a combination thereof.

In some forms, the electrical characteristic data includes a voltage of the heater, an electric current of the heater, or a combination thereof.

In some forms, the performance characteristic includes a fluid flow temperature value based on the temperature data of the heater, the temperature data, or a combination thereof.

In some forms, the performance characteristic is determined based on a statistical analysis of the operational data.

In some forms, the statistical analysis is a deviation from a predefined setpoint, a statistical representation as a function of time of the operational data, or a combination thereof.

In some forms, the statistical analysis is a statistical representation of a heater zone of the thermal system, where the heater zone includes one or more heaters of a plurality of heaters of the thermal system.

In some forms, the reference virtual model is a digital representation of the gas delivery system, the thermal system, the fluid flow line, or a combination thereof.

In some forms, the reference virtual model provides a location of one or more heaters of the thermal system disposed at the fluid flow line, one or more sensors disposed at the fluid flow line, or a combination thereof.

In some forms, the dynamic state model is a thermal profile representation of the fluid flow line.

In some forms, the method further includes displaying, using a display device, the dynamic state model and one or more filter user interface elements that cause the display device to selectively display a set of the performance characteristics in response to a user input.

In some forms, the method further includes generating an operation recommendation for one or more heaters of the thermal system based on one or more precursors of the semiconductor processing system.

The present disclosure also provides a system for monitoring a semiconductor processing system including a gas delivery system, a thermal system, and a fluid flow line. The system includes a processor and a nontransitory computer-readable medium including instructions that are executable by the processor. The instructions include obtaining a plurality of operational data from the gas delivery system, the thermal system, or a combination thereof and determining a performance characteristic of the fluid flow line based on one or more operational data of the plurality of operational data. The instructions include identifying one or more locations associated with the one or more operational data in a reference virtual model and generating a dynamic state model of the fluid flow line based on the reference virtual model, the one or more identified locations, and the determined performance characteristic, where the dynamic state model is a digital representation of the fluid flow line.

In some forms, the instructions further include identifying the reference virtual model of the fluid flow line from among a plurality of reference virtual models stored in a database.

In some forms, the digital representation is one of a two-dimensional image and a three-dimensional image.

In some forms, the plurality of operational data includes temperature data of a heater, temperature data of the fluid flow line, electrical characteristic data of the heater, pump data of a pump, or a combination thereof.

In some forms, the electrical characteristic data includes a voltage of the heater, an electric current of the heater, or a combination thereof.

In some forms, the performance characteristic includes a fluid flow temperature value based on the temperature data of the heater, the temperature data, or a combination thereof.

In some forms, the performance characteristic is determined based on a statistical analysis of the operational data.

In some forms, the statistical analysis is a deviation from a predefined setpoint, a statistical representation as a function of time of the operational data, or a combination thereof.

In some forms, the statistical analysis is a statistical representation of a heater zone of the thermal system, where the heater zone includes one or more heaters of a plurality of heaters of the thermal system.

In some forms, the reference virtual model is a digital representation of the gas delivery system, the thermal system, the fluid flow line, or a combination thereof.

In some forms, the reference virtual model provides a location of one or more heaters of the thermal system disposed at the fluid flow line, one or more sensors disposed at the fluid flow line, or a combination thereof.

In some forms, the dynamic state model is a thermal profile representation of the fluid flow line.

In some forms, the instructions further include displaying, using a display device, the dynamic state model and one or more filter user interface elements that cause the display device to selectively display a set of the performance characteristics in response to a user input.

In some forms, the instructions further include generating an operation recommendation for one or more heaters of the thermal system based on one or more precursors of the semiconductor processing system.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

FIG. 5 is a schematic diagram of a user interface of a user interface device according to the teachings of the present disclosure.

Figure 1:
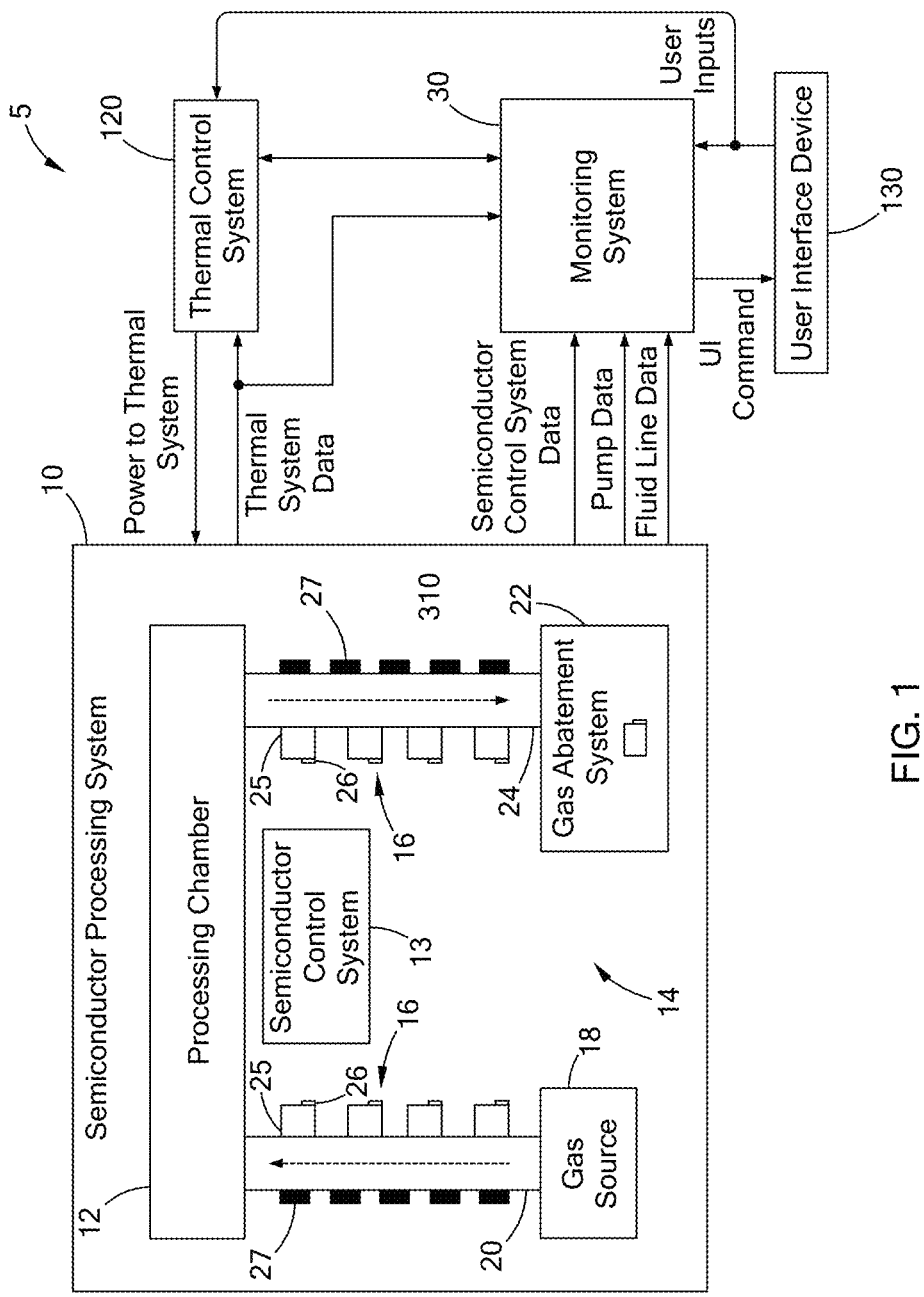
FIG. 1 is a functional block diagram of a semiconductor processing system, a thermal control system, and a monitoring system for monitoring the operation of the semiconductor processing system according to the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Referring to FIG. 1, a system 5 including a semiconductor processing system 10, a monitoring system 30 for monitoring an operation of the semiconductor processing system 10, a thermal control system 120, and a user interface device 130 is shown. In one form, the components of the monitoring system 30, the semiconductor processing system 10, the thermal control system 120, and the user interface device 130 are communicably coupled using a wired communication protocol and/or a wireless communication protocol (e.g., a Bluetooth®-type protocol, a cellular protocol, a wireless fidelity (Wi-Fi)-type protocol, a near-field communication (NFC) protocol, an ultra-wideband (UWB) protocol, among others).

In one form, the semiconductor processing system 10 generally includes a processing chamber 12, a semiconductor control system 13, a gas delivery system 14, and a thermal system 16. In one form, the gas delivery system 14 includes a gas source 18, a gas supply line 20 for delivering process gases from the gas source 18 to the processing chamber 12, a gas abatement system 22, and an exhaust line 24 for delivering exhaust gases, such as unused process gases and by-products, from the processing chamber 12 to the gas abatement system 22. In one form, the process gases used in semiconductor wafer processing may be toxic, pyrophoric, or corrosive (e.g., ammonia, silane, argon, arsine, and/or phosphine, among other gases). In some forms, unused process gases and hazardous by-products are delivered to the gas abatement system 22, where the unused process gases and by-products are cleansed and neutralized prior to being released to the environment. In the following, process gases and exhaust gases may collectively be referred to as "gas".

In one form, the thermal system 16 includes a plurality of heaters 25 that are disposed at different locations along the gas supply line 20 and the exhaust line 24 to heat gases flowing in the gas supply line 20 and the exhaust line 24. In one form, the plurality of heaters 25 are flexible heaters wrapped about the gas supply line 20 and the exhaust line 24 to heat the gas therein. In another example, the plurality of heaters 25 are cartridge heaters disposed to directly heat the gas flowing through the gas supply line 20 and the exhaust line 24. Heating the gas as it is delivered to the process chamber 12 and the gas abatement system 22 facilitates wafer processing in the processing chamber 12 and the exhaust gas treatment in the gas abatement system 22. Furthermore, heating the gas inhibits contaminants from depositing along the walls of the gas supply line 20 and the exhaust line 24 and thus, clogging in the gas supply line 20 and the exhaust line 24. In one form, the plurality of heaters 25 are independently controlled by a thermal control system 120.

In one form, the thermal system 16 includes a plurality of thermal sensors 26 for measuring thermal system data that includes, but is not limited to, a temperature of the heater 25, electrical characteristic data of the heater 25 (e.g., a voltage, an electric current, an electrical power, and/or a resistance of the heater 25), among others. The plurality of thermal sensors 26 may include a thermocouple, a resistance temperature detector, an infrared camera, a current sensor, and/or a voltage sensor, among others.

In one form, the plurality of heaters 25 may generate the performance characteristic in lieu of or in addition to the one or more thermal sensors 26 generating the performance characteristics. As an example, the heater 25 is provided as a two-wire heater that includes one or more resistive heating elements that operate as a sensor for measuring an average temperature of the resistive heating element based on a resistance of the resistive heating element. More particularly, such a two-wire heater is disclosed in U.S. Pat. No. 7,196,295, which is commonly owned with the present application and the contents of which are incorporated herein by reference in its entirety. In a two-wire thermal system, the thermal system 16 is an adaptive thermal system that merges heater designs with controls that incorporate power, resistance, voltage, and current in a customizable feedback control system that limits one or more these parameters (i.e., power, resistance, voltage, and current) while controlling another. In one form, the controller is configured to monitor at least one of current, voltage, and power delivered to the resistive heating element to determine resistance, and thus, temperature of the resistive heating element.

In one form, the gas delivery system 14 includes a plurality of fluid line sensors 27 disposed proximate to (i.e., adjacent and/or near) the gas supply line 20 and the exhaust line 24 for measuring fluid line data. As an example, the plurality of fluid line sensors 27 are mounted to the gas supply line 20 and the exhaust line 24 to monitor for cold spots that can cause clogging, heat sinks, and hot spots that lead to system degradation and downtime. In one form, the fluid line data may include, but is not limited to: temperature, flow rate and pressure of the gases, and the process gases being used. Accordingly, the fluid line sensors 27 include, but are not limited to: temperature sensors, pressure sensors, flow rate meters, and gas sensors, among others.

In one form, the gas delivery system 14 includes a pump sensor 28 disposed proximate a pump 29 of the gas source 18 for measuring pump data, such as a temperature and/or pressure of the pump. Accordingly, the pump sensor 28 may include a temperature sensor or other similar sensor configured to measure the temperature of the pump 29. In one form, the operating temperature of the pump can be used to control the temperature generated by heaters 25 located proximate to the pump. Specifically, when the pump runs hot, a heater next to the pump may provide little to no heat. In one form, the pump 29 is configured to remove exhaust gas from the processing chamber 12 to the gas abatement system 22. In some forms, the pump temperature data may be provided to the semiconductor control system 13 to control the operation of the semiconductor processing system 10.

In one form, the thermal control system 120 is configured to control the electrical power provided to the thermal system 16 based on defined control process and/or a thermal system command received from the monitoring system 30 and/or a user input received from the user interface device 130 (e.g., a human machine interface (HMI)). As an example, the thermal control system 120 may employ a proportional-integral-derivative (PID) control routine, a model predictive control routine, a cascade control routine, or a differential control routine, as the defined control process, to adjust the electrical power provided to thermal system 16 based on thermal sensor data and therefore, adjust the temperature of at least one of the heaters 25. As described herein, the user may also input commands to the thermal system via the user interface device 130 to control the heaters 25.

In one form, if the heaters 25 are heaters having a sufficiently high temperature coefficient of resistance (TCR), the thermal control system 120 is configured to determine the based on the resistance of a resistive heating element of the heaters 25. As an example, if the heaters 25 are two-wire heaters, the thermal control system 20 is provided as a two-wire thermal control system. Typically, in a two-wire system, the resistive heating elements are defined by a material that exhibits a varying resistance with varying temperature such that an average temperature of the resistive heating element is determined based on a change in resistance of the resistive heating element. In one form, the resistance of the resistive heating element is calculated by first measuring the voltage across and the current through the heating elements and then, using Ohm's law, the resistance is determined. In one form, a resistance-temperature association (e.g., algorithm, look-up table, among others) is used to determine the temperature based on the resistance. The two-wire thermal control system is configured to perform one or more control processes to determine the desired power to be applied to the heaters. Example two-wire control system and associated control processes are described in co-pending application U.S. Ser. No. 15/624,060, filed Jun. 15, 2017 and titled "POWER CONVERTER FOR A THERMAL SYSTEM" and co-pending application U.S. Ser. No. 16/100,585, filed Aug. 10, 2018 and titled "SYSTEM AND METHOD FOR CONTROLLING POWER TO A HEATER, which is commonly owned with the present application and the contents of which are incorporated herein by reference in its entirety.

In one form, the semiconductor control system 13 is configured to control and includes information for controlling the semiconductor processing system 10. As an example, the semiconductor control system 13 stores precursors and a time in which the precursors are introduced into the processing chamber 12 during atomic layer deposition (ALD) processes. As another example, the semiconductor control system 13 includes information indicating how the heaters 25 respond to a setpoint adjustment, such as percentage of power or a cooling rate that is required to achieve a target setpoint.

In one form, the thermal control system 120 is configured provide thermal system data to the monitoring system 30. For example, the system 120 provides the amount of power/energy being supplied to the heaters 25. If a two-wire control system, the thermal control system 120 is configured to provide the temperature, resistance, voltage, current, and/or power to the monitoring system 30.

Figure 2:
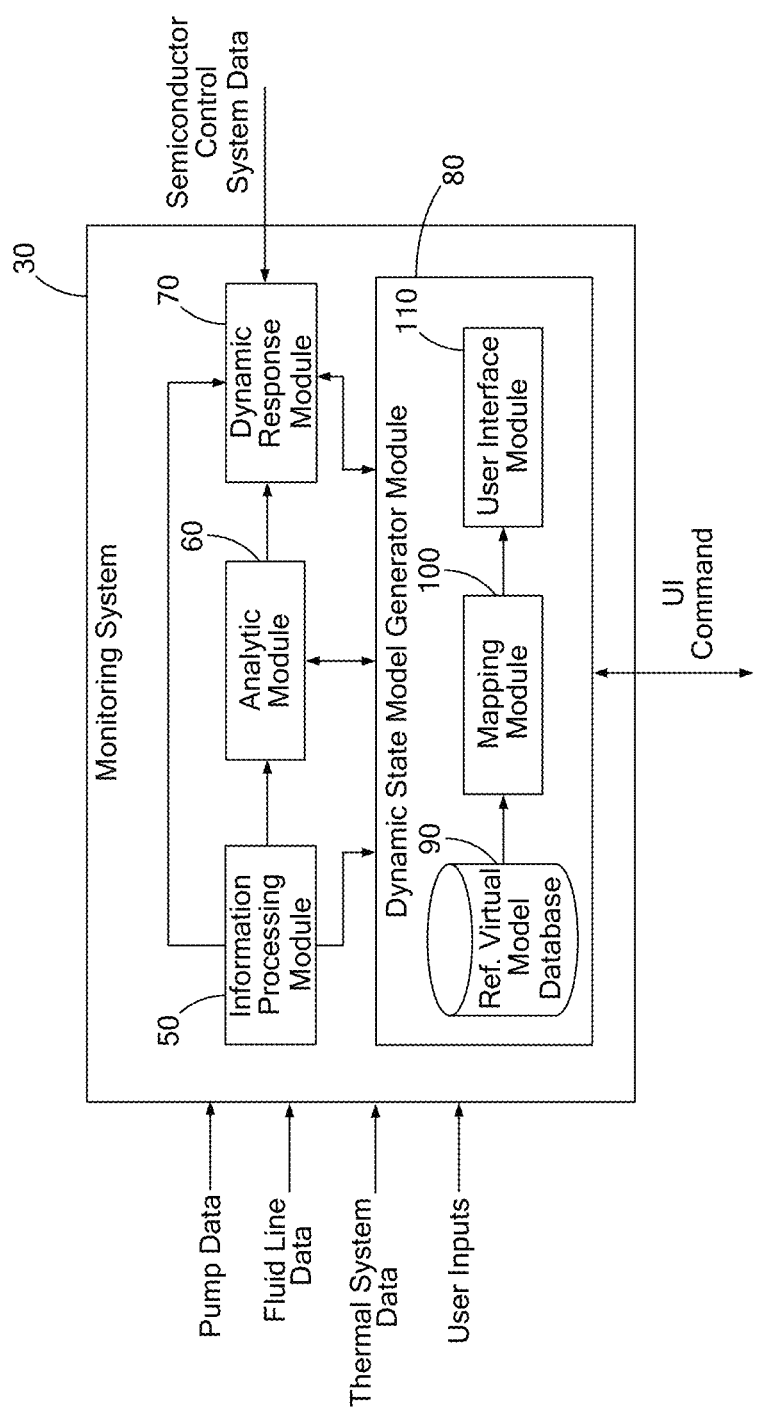
FIG. 2 is a functional block diagram of the monitoring system of FIG. 1 according to the teachings of the present disclosure.

Referring to FIG. 2, the monitoring system 30 includes an information processing module 50, an analytic module 60, a dynamic response module 70, and a dynamic state model generator module 80. It should be readily understood that any one of the components of the control system 40 can be provided at the same location or distributed at different locations (e.g., via one or more edge computing devices) and communicably coupled accordingly. While the dynamic response module 70 is shown as part of the monitoring system 30, it should be understood that the dynamic response module 70 may be implemented as part of the thermal control system 120 in lieu of the monitoring system 30 in other forms.

In one form, the information processing module 50 is configured to process operational data and/or user inputs received from the user interface device 130 to provide the operational data and/or user inputs to the appropriate module. Operational data includes the pump data, the fluid line data, the semiconductor control system data, and/or the thermal system data. As an example, the information processing module 50 provides user inputs to the dynamic state model generator module 80 and the operational data to at least one of the analytic module 60, the dynamic response module 70, or the dynamic state model generator module 80.

In one form, the analytic module 60 is configured to determine the performance characteristic of the fluid flow line (i.e., the gas supply line 20 and/or the exhaust line 24), the thermal system 16, and/or the gas source 18 by performing a statistical analysis on one or more operational data. Statistical analyses may include, but are not limited to: a deviation from a predefined setpoint (as a percentage or a value), a statistical representation of the operational data (e.g., an average, median, standard deviation, variance, minimum, maximum, among other statistical representations) as a function of time, a statistical representation of a heater zone of the thermal system, among others.

As an example, based on the temperature of the heaters 25, the analytic module 60 determines a thermal profile representation of the fluid flow line, as the performance characteristic. In one form, the thermal profile representation provides numerical temperatures values, and/or a thermal map of the fluid flow line, among others. In another example, using the power applied to the heater 25, the analytic module 60 is configured to associate temperature of the heater 25 with the amount of energy applied to the heaters 25. More particularly, the analytic module 60 is configured to track the energy applied to the heaters 25 with temperature characteristic(s) of the heaters 25, such as an average temperature of the heater over a period of time and/or a temperature deviation of the heater based on the measured temperature and a desired temperature setpoint. As another example, the analytic module 60 determines a material build-up within the fluid flow line, as the performance characteristic, based on the time required for heating a specific area of the gas lines to a desired temperature, as indicated by fluid line data.

As an additional example, the heaters 25 are grouped into a plurality of zones and the thermal system data associated with a respective zone is employed for determining the performance characteristic at that particular zone. Specifically, the analytic module 60 performs analytics for each zone based on data associated with respective zone. For example, if a first group of temperature data is associated with a first zone of the fluid line system, the analytic module 60 determines a zone temperature, as performance characteristic, based on a statistical representation of the first group of temperature data. In yet another example, the analytic module 60 is configured to determine a zone power based on statistical representation of electrical characteristic of the heaters of the first zone (e.g., power, current, voltage, energy, etc.). While specific examples are provided with respect temperature and energy data, the analytic module 60 is configured to perform similar statistical analysis employing other types of operational data, such as pump data. As yet another example, the analytic module 60 may determine data related to the pump 29 and to the abatement of the exhaust gas in the gas abatement system 22 based on the temperature data from the pump sensor 28.

In one form, the dynamic response module 70 receives the semiconductor control system data and dynamically provides an operation recommendation for the heaters 25 to the thermal control system 120. As an example, the dynamic response module 70 receives semiconductor control system data related to the types of precursors and when the precursors are to be introduced into the processing chamber 12. Employing predefined control models and/or algorithms and data from the analytics module 60, the dynamic response module 70 determines the operation recommendation for one or more heaters (e.g., a recommended setpoint for the heaters 25) and provides the recommendation to the thermal control system 120. Example precursors include, but are not limited to: a new wafer being introduced into the processing chamber, a new gas and/or additional gas, and/or a time for a cleaning cycle. In one form, the predefined control models and/or algorithms are determined based on historical data and/or experiments that indicate the response of the semiconductor processing system 10 when a give precursor is exerted to the system 10. Accordingly, with the operation recommendation from the dynamic response module 70, the thermal control system 120 may adjust the setpoint for the heaters 25 before, for example, the new wafer or process is started to improve response of the heaters 25.

In one form, the dynamic state model generator module 80 is configured to generate a dynamic state model of the fluid flow line, which is one of a two-dimensional or a three-dimensional image representing the corresponding fluid flow line and the performance characteristic as determined by the analytic module 60. In one form, the dynamic state model generator module 80 includes a reference virtual model database 90, a mapping module 100, and a user interface module 110.

In one form, the reference virtual model database 90 includes a plurality of reference virtual models, where each reference virtual model is a digital representation of a respective component and location thereof in the semiconductor processing system 10. As an example, a first reference virtual model corresponds to a digital representation of the size and location of the gas supply line 20, and a second reference virtual model corresponds to a digital representation of the size and location of the exhaust line 24. Furthermore, additional reference virtual models may correspond to size and/or location of the heaters 25, the thermal sensors 26, the processing chamber 12, and/or any other component of the semiconductor processing system 10.

In one form, the mapping module 100 identifies one or more locations associated with the one or more operational data in the identified reference virtual model. As an example, the mapping module 100 identifies the locations of the thermal sensors 26 and/or the corresponding heaters 25 based on identification information of the thermal system data that uniquely identifies the thermal sensors 26 and/or corresponding heaters 25. In one form, the mapping module 100 generates the dynamic state model based on the reference virtual model, the one or more identified locations, and/or the determined performance characteristic. In one form, the dynamic state model is a two-dimensional image representing the fluid flow line and the performance characteristic (e.g., the thermal profile representation) as determined by the analytic module 60.

In one form, the user interface module 110 provides the dynamic state module to the user interface device 130, as the user interface command, for display and visualization by a user. In some forms, the user interface module 110 may also provide the operational data, the statistical analysis, and/or the dynamic response to the user interface device 130 for display and visualization by a user.

In an example application, the dynamic response module 70 provides the operational data, the performance characteristic (e.g., the statistical analysis), and the adjustment recommendations to the mapping module 100. In response, the mapping module 100 generates the dynamic state model based on the reference virtual model, the one or more identified locations associated with the operational data, and the determined performance characteristic. Furthermore, the mapping module 100 generates the dynamic response report and user interface elements for controlling the thermal system 14 based on the adjustment recommendations generated by the dynamic response module 70. Subsequently, the user interface module 110 transmits the user interface command to the user interface device 130 to display the dynamic state model, the dynamic response report, and the user interface elements. The user interface elements may enable a user to adjust the parameters of the thermal system 14, such as adjusting an electrical power provided to thermal system 16 and the temperature of at least one of the heaters 25, via the thermal system command. In some forms, the user interface elements may enable a user to filter the dynamic response report to only view desired operational data of the semiconductor processing system 10.

Figure 3:
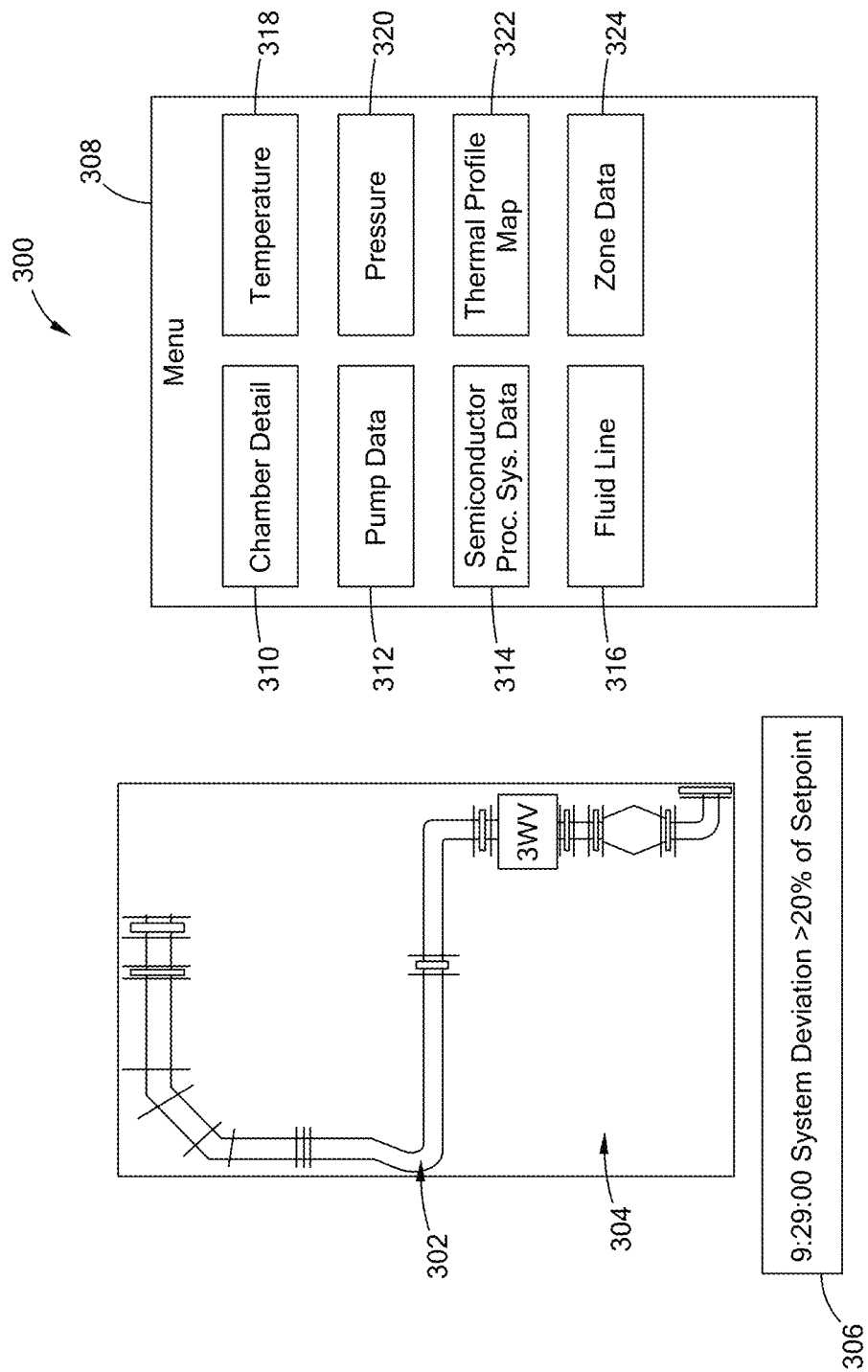
FIG. 3 is a schematic diagram of a user interface of a user interface device according to the teachings of the present disclosure.

Referring to FIG. 3, an example interface 300 generated by the user interface module 110 and displayed by the user interface device 130 is shown. The interface 300 includes dynamic state model 302, which is a two-dimensional virtual image of a fluid flow line the semiconductor processing system 10. In some forms, the dynamic state model 302 includes overlayed status region 304, which selectively outputs a predefined color or other distinguishing graphic indicating whether the respective fluid flow line is operating at an expected operation state (e.g., normal operation state) or an unexpected operation state (e.g., abnormal operation). For example, overlayed status region 304 can be shown as green for normal operation, red for abnormal operation, and yellow when the operation state is within a defined threshold. In some forms, the interface 300 includes an alarm bar element 306 indicating a type of alarm and/or time associated with the unexpected/less than optimal operation state.

Figure 4:
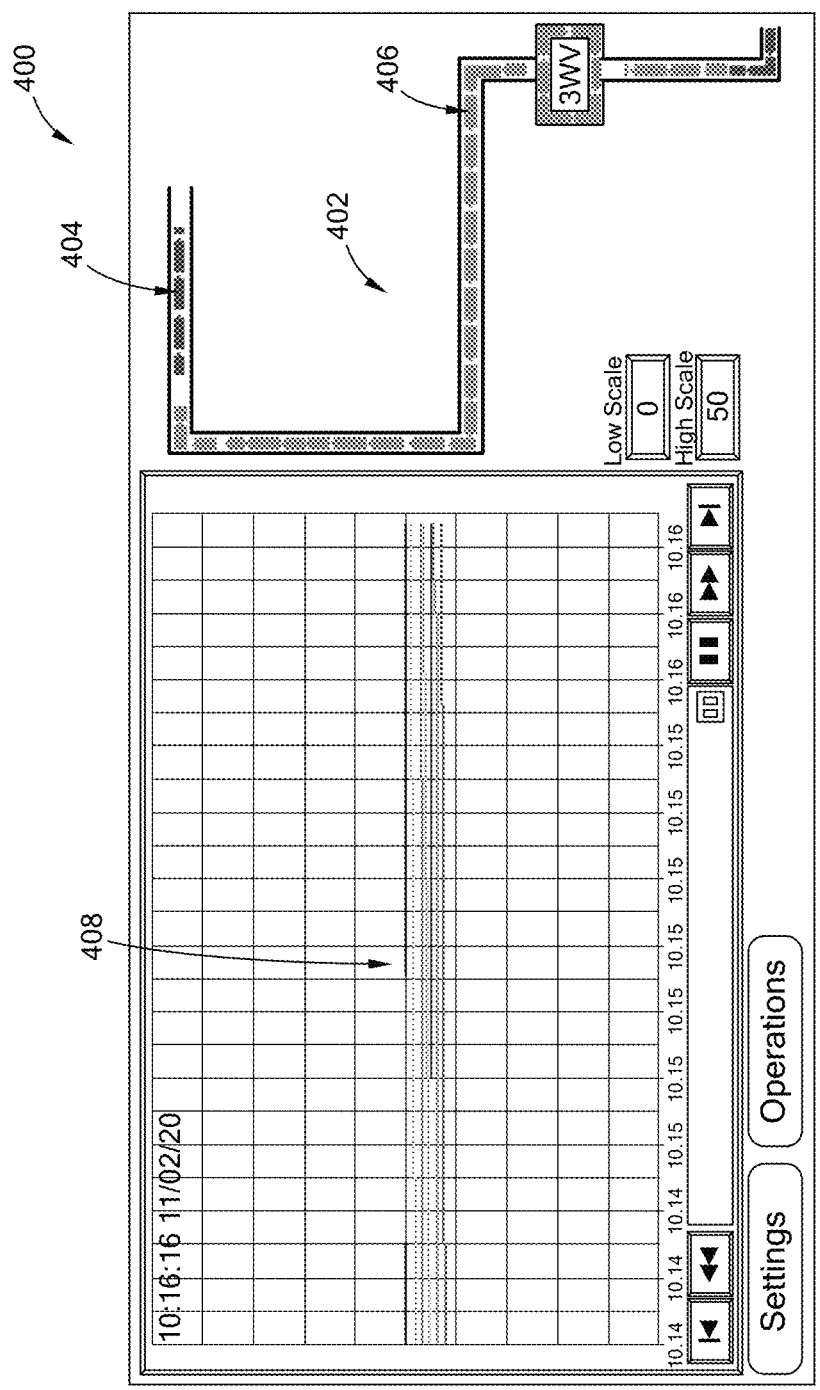
FIG. 4 is a schematic diagram of a user interface of a user interface device according to the teachings of the present disclosure.

In some forms, the interface 300 includes menu filter elements 310, 312, 314, 316, 318, 320, 322, 324 that, when selected by the user, cause the user interface device 130 to display relevant information associated with the selected filter element. As an example, selecting filter element 310 may cause the user interface device 130 to display user interface 400 shown in FIG. 4, which includes dynamic state model 402 and status regions 404, 406 that selectively output a predefined color or other distinguishing graphic indicating whether the respective fluid flow line at a corresponding location is operating at an expected operation state or an unexpected operation state. Furthermore, the user interface 400 may include a trend graph 408 indicating a trend of the operational data as a function of time.

As another example, selecting filter element 324 may cause the user interface device 130 to display user interface 500 shown in FIG. 5, which includes a menu 502 showing heater zone information (e.g., a temperature, a wattage, a voltage, a pressure, a resistance, among others) for each heater zone of the respective fluid flow line. While specific interfaces are illustrated, the user interfaces may be configured in various suitable ways to provide the virtual image, a status of the fluid flow line, among other information.

Figure 6:
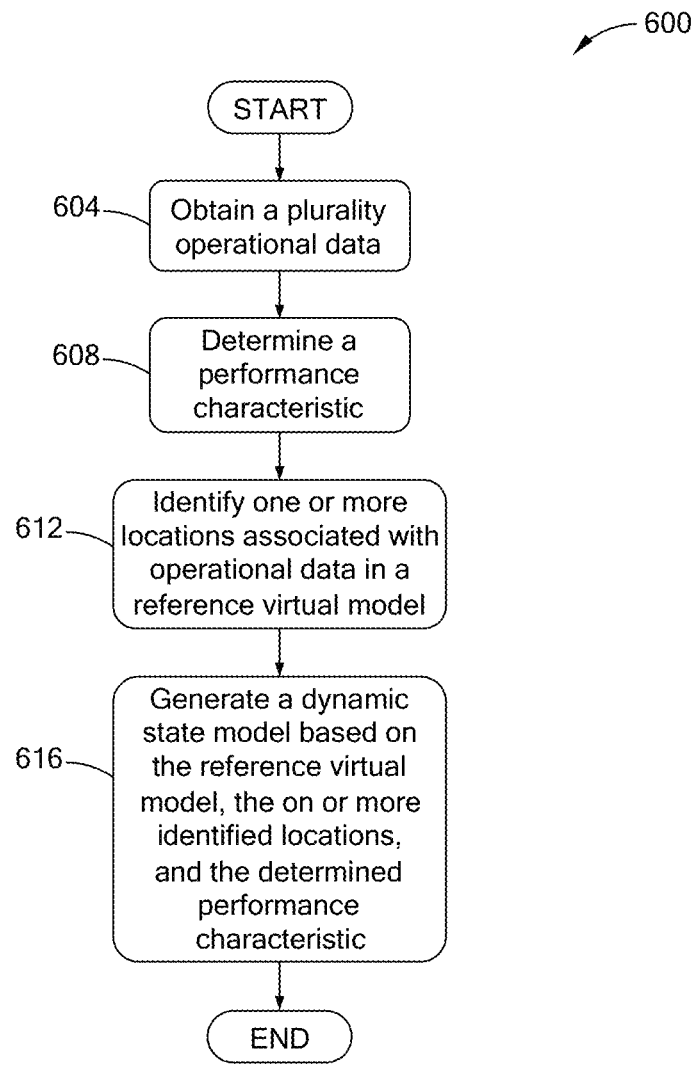
FIG. 6 is a flowchart illustrating an example control routine according to the teachings of the present disclosure.

With reference to FIG. 6, a routine 600 for monitoring the semiconductor processing system 10 is shown and performed by the monitoring system 30. At 604, the monitoring system 30 obtains a plurality of operational data from the gas delivery system, the thermal system, or a combination thereof. At 608, the monitoring system 30 determines a performance characteristic of the fluid flow line based on the operational data. At 612, the monitoring system 30 identifies one or more locations associated with the operational data in a reference virtual model associated with the fluid flow lines. At 616, the monitoring system 30 generates a dynamic state model of the fluid flow lines based on the reference virtual model, the one or more identified locations, and the determined performance characteristic.

The monitoring system 30 described herein enables one to visualize the changes of the semiconductor processing system 10 as different process gasses flow through the fluid flow lines and their impact on the variables mentioned above. Energy supplied to the lines can be visualized to their respective zone of control and the semiconductor processing system 10 can be optimized for efficiency. Additionally, cold spots on the gas supply line 20 or the exhaust line 24 that may lead to clogging can be identified and located for system maintenance. By mapping clog prediction locations, maintenance teams can locate where the lines need to be removed and replaced. As an example, thermal data may be collected by the fluid line sensors 27. The dynamic state model generator module 80 compiles and formats the thermal data into a virtual image, which may show the thermal data in different colors based on the temperatures. Therefore, an operator can determine whether the temperature is uniform on the fluid flow line and/or the location of cold spots based on the colors.

Furthermore, the monitoring system 30 described herein performs a virtual mapping based on measured data and a statistical analysis thereof to produce a virtual image that provides a visual representation of the data of interest to the operator. Therefore, the operator can identify the locations of cold spots and a possible clog before clogging occurs. Furthermore, the monitoring system 30 can provide instructions for enhancing the operation of the gas source 18 or to validate the operation of the gas source 18. By using the monitoring system 30 described herein, the visualization of the collected and analyzed data can be used to reduce heat loss and to improve efficiency.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice; material, manufacturing, and assembly tolerances; and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

In the figures, the direction of an arrow, as indicated by the arrowhead, generally demonstrates the flow of information (such as data or instructions) that is of interest to the illustration. For example, when element A and element B exchange a variety of information, but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, the term controller may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality, such as, but not limited to, movement drivers and systems, transceivers, routers, input/output interface hardware, among others; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

What is claimed is:

1. A method for monitoring a semiconductor processing system including a gas delivery system, a thermal system, and a fluid flow line, the method comprising:
   obtaining a plurality of operational data from the gas delivery system, the thermal system, or a combination thereof;
   determining a performance characteristic of the fluid flow line based on one or more operational data of the plurality of operational data;
   identifying one or more locations associated with the one or more operational data in a reference virtual model; and
   generating a dynamic state model of the fluid flow line based on the reference virtual model, the one or more identified locations, and the determined performance characteristic, wherein the dynamic state model is a digital representation of the fluid flow line, the digital representation is one of a two-dimensional image of the fluid flow line and a three-dimensional image of the fluid flow line, and the digital representation includes at least one status region that graphically indicates the performance characteristic of the fluid flow line.

2. The method of claim 1 further comprising identifying the reference virtual model of the fluid flow line from among a plurality of reference virtual models stored in a database.

3. The method of claim 1, wherein the plurality of operational data includes temperature data of a heater, temperature data of the fluid flow line, electrical characteristic data of the heater, pump data of a pump, or a combination thereof.

4. The method of claim 3, wherein the electrical characteristic data includes a voltage of the heater, an electric current of the heater, or a combination thereof.

5. The method of claim 3, wherein the performance characteristic includes a fluid flow temperature value based on the temperature data of the heater, the temperature data, or a combination thereof.

6. The method of claim 1, wherein the performance characteristic is determined based on a statistical analysis of the operational data.

7. The method of claim 6, wherein the statistical analysis is a deviation from a predefined setpoint, a statistical representation as a function of time of the operational data, or a combination thereof.

8. The method of claim 6, wherein the statistical analysis is a statistical representation of a heater zone of the thermal system, wherein the heater zone includes one or more heaters of a plurality of heaters of the thermal system.

9. The method of claim 1, wherein the reference virtual model is a digital representation of the gas delivery system, the thermal system, the fluid flow line, or a combination thereof.

10. The method of claim 1, wherein the reference virtual model provides a location of one or more heaters of the thermal system disposed at the fluid flow line, one or more sensors disposed at the fluid flow line, or a combination thereof.

11. The method of claim 10, wherein the location of the one or more heaters and the one or more sensors is provided based on identification information of the one or more heaters.

12. The method of claim 1, wherein the dynamic state model is a thermal profile representation of the fluid flow line.

13. The method of claim 1 further comprising displaying, using a display device, the dynamic state model and one or more filter user interface elements that cause the display device to selectively display a set of the performance characteristics in response to a user input.

14. The method of claim 1 further comprising generating an operation recommendation for one or more heaters of the thermal system based on one or more precursors of the semiconductor processing system.

15. A system for monitoring a semiconductor processing system including a gas delivery system, a thermal system, and a fluid flow line, the system comprising:
   a processor; and
   a nontransitory computer-readable medium including instructions that are executable by the processor, wherein the instructions include:
      obtaining a plurality of operational data from the gas delivery system, the thermal system, or a combination thereof;
      determining a performance characteristic of the fluid flow line based on one or more operational data of the plurality of operational data;
      identifying one or more locations associated with the one or more operational data in a reference virtual model; and generating a dynamic state model of the fluid flow line based on the reference virtual model, the one or more identified locations, and the determined performance characteristic, wherein the dynamic state model is a digital representation of the fluid flow line, the digital representation is one of a two-dimensional image of the fluid flow line and a three-dimensional image of the fluid flow line, and the digital representation includes at least one status region that graphically indicates the performance characteristic of the fluid flow line.

16. The system of claim 15 wherein the instructions further include identifying the reference virtual model of the fluid flow line from among a plurality of reference virtual models stored in a database.

17. The system of claim 15, wherein the plurality of operational data includes temperature data of a heater, temperature data of the fluid flow line, electrical characteristic data of the heater, pump data of a pump, or a combination thereof.

18. The system of claim 17, wherein the electrical characteristic data includes a voltage of the heater, an electric current of the heater, or a combination thereof.

19. The system of claim 17, wherein the performance characteristic includes a fluid flow temperature value based on the temperature data of the heater, the temperature data, or a combination thereof.

20. The system of claim 15, wherein the performance characteristic is determined based on a statistical analysis of the operational data.

21. The system of claim 20, wherein the statistical analysis is a deviation from a predefined setpoint, a statistical representation as a function of time of the operational data, or a combination thereof.

22. The system of claim 20, wherein the statistical analysis is a statistical representation of a heater zone of the thermal system, wherein the heater zone includes one or more heaters of a plurality of heaters of the thermal system.

23. The system of claim 15, wherein the reference virtual model is a digital representation of the gas delivery system, the thermal system, the fluid flow line, or a combination thereof.

24. The system of claim 15, wherein the reference virtual model provides a location of one or more heaters of the thermal system disposed at the fluid flow line, one or more sensors disposed at the fluid flow line, or a combination thereof.

25. The system of claim 24, wherein the location of the one or more heaters and the one or more sensors is provided based on identification information of the one or more heaters.

26. The system of claim 15, wherein the dynamic state model is a thermal profile representation of the fluid flow line.

27. The system of claim 15, wherein the instructions further include displaying, using a display device, the dynamic state model and one or more filter user interface elements that cause the display device to selectively display a set of the performance characteristics in response to a user input.

28. The system of claim 15, wherein the instructions further include generating an operation recommendation for one or more heaters of the thermal system based on one or more precursors of the semiconductor processing system.

* * * * *